United States Patent
Kirschstein et al.

(10) Patent No.: US 6,480,369 B1
(45) Date of Patent: Nov. 12, 2002

(54) SYSTEM FOR RECEIVING AND RETAINING A SUBSTRATE

(75) Inventors: Ulf-Carsten Kirschstein, Jena-Priessnitz (DE); Stefan Risse, Jena (DE); Christoph Damm, Jena (DE); Thomas Peschel, Jena (DE)

(73) Assignee: Leica Microststems Lithography GmbH, Jena (DE)

( * ) Notice: Subject to any disclaimer, the term of this patent is extended or adjusted under 35 U.S.C. 154(b) by 0 days.

(21) Appl. No.: 09/600,478

(22) PCT Filed: Nov. 16, 1999

(86) PCT No.: PCT/DE99/03637
§ 371 (c)(1),
(2), (4) Date: Oct. 4, 2000

(87) PCT Pub. No.: WO00/30172
PCT Pub. Date: May 25, 2000

(30) Foreign Application Priority Data

Nov. 18, 1998 (DE) .......................... 198 53 092

(51) Int. Cl.[7] .............................................. H02N 13/00
(52) U.S. Cl. ...................................................... 361/234
(58) Field of Search ................................. 361/234, 233, 361/235; 279/128

(56) References Cited

U.S. PATENT DOCUMENTS

| | | | |
|---|---|---|---|
| 3,993,509 A | 11/1976 | McGinty | 148/1.5 |
| 5,258,047 A | 11/1993 | Tokisue et al. | 29/25.01 |
| 5,398,271 A | 3/1995 | Nishida et al. | 378/34 |
| 5,535,090 A | 7/1996 | Sherman | 361/234 |
| 5,600,530 A | 2/1997 | Smith | 361/223 |
| 5,644,137 A | 7/1997 | Waggener et al. | 250/49.2 |
| 5,777,838 A | 7/1998 | Tamagawa et al. | 361/234 |
| 5,822,171 A * | 10/1998 | Shamouilian et al. | 361/234 |
| 5,870,271 A * | 2/1999 | Herchen | 361/234 |
| 5,880,923 A * | 3/1999 | Hausmann et al. | 361/234 |
| 6,023,405 A * | 2/2000 | Shamouilian et al. | 361/234 |
| 6,048,434 A * | 4/2000 | Tamura et al. | 156/345 |
| 6,055,150 A * | 4/2000 | Clinton et al. | 361/234 |
| 6,219,219 B1 * | 4/2001 | Hausmann et al. | 361/234 |

FOREIGN PATENT DOCUMENTS

| | | |
|---|---|---|
| DE | 88 00 272.1 | 4/1988 |
| DE | 41 38 731 | 5/1992 |
| EP | 0 831 526 | 9/1997 |

OTHER PUBLICATIONS

Abstract of Japan 6–112115 (Apr. 22, 1994), "Spindle Chuck and Spinner", Application of Masahiro Urakuchi, Application No. 4–256177 (Sep. 25, 1992).

Sherman et al.; "Sapphire Electrostatic End Effectors For Vacuum Wafer Handlers"; Semiconductor International; vol. 20, No. 8; Jul. 1997; pp. 319–322.

* cited by examiner

*Primary Examiner*—Adolf Deneke Berhane
(74) *Attorney, Agent, or Firm*—Foley & Lardner

(57) ABSTRACT

The invention refers to a receiving and supporting system for a substrate (17) in an exposure system, which is provided with a handling system for the supply of the substrate (17), with an electrostatic chuck arrangement (1) moveable in X, Y coordinates, for the support of the substrate (17) during the exposure, and with an exposure optic, from which a right angled particle radiation, in Z-direction is directed toward the substrate surface.

In regard to the respective supporting system, at least a second electrostatic chuck arrangement (6) is provided, which—similar to the first chuck arrangement (1), for the support of the substrate (17) during the exposure, provides a bearing surface for the substrate, whereby the bearing surface of this second chuck arrangement (6) is positioned movable in Z coordinate. In regard to their supporting force, both chuck arrangements (1, 6) are arranged in such a manner, that the substrate (17) is securely positioned when being supported either on the first chuck arrangement (1) or when being supported exclusively on the second chuck arrangement (6).

20 Claims, 4 Drawing Sheets

SYSTEM FOR RECEIVING AND RETAINING A SUBSTRATE

CROSS REFERENCE TO RELATED APPLICATIONS

This invention claims priority of a German filed patent application DE P 198 53 092.7.

FIELD OF THE INVENTION

The invention relates to a receiving and supporting system for a substrate in an exposure system, which is supplied with an electro-statical chuck arrangement movable in X, Y coordinates to support the substrate on a bearing surface during exposure.

BACKGROUND OF THE INVENTION

Supporting systems for the reception of substrates, especially of masks and wafers, during the time of exposure, are known in various models according to the state of art.

As a rule, those supporting systems are arranged on a table, movable in two coordinates X, Y, having a bearing area for the substrate, on which the substrate is laid prior to the exposure process and where it is held while the table step by step is moved into direction X and/or Y and where the substrate in succession is brought into the desired position of exposure.

In most cases, the bearing levels are formed with high-plane bearing surfaces, possibly also with several puncti-form bearing elements.

The basic bodies, mounting plate, etc., on which the bearing elements are positioned or bearing surfaces are formed, are in most cases mechanically affixed to the table via metering means for the positioning of the substrate in Z coordinate. The Z coordinate thereby corresponds to the exposure direction of the exposure beam-path, directed right-angled onto the substrate's surface.

The sensitive handling of the substrate during the receiving phase into the exposure system, and the precision during the positioning of the substrate surface relative to the exposure system are substantial criterion in regard to the quality and sensitivity of structure during exposure and increasing importance, as far as future attempts of the micro-electronic industry for the reduction of structure dimensions are concerned.

Since the substrate itself is not stable against deformations, the main problems with these versions of supporting systems appear in the precision of the positioning for the substrate, even in case of temperature-or pressure variations, as well as in the dimensional shape of the substrate support.

Therefore it has to be taken into account, that no mechanical force, regardless what origin, is influencing the substrate, which would lead to deformations and therefore unacceptable deviations in structure.

Furthermore, for the construction of supporting systems it has to be considered, that the direction of the exposure beam is not unintentionally influenced by magnetic fields and/or electric power charges. Above all, the manufacturing of supporting systems must be kept within economically reasonable limits.

In consideration of these high requirements, the supporting systems according to the state of art need to be evaluated.

The U.S. Pat. No. 5,535,090 and the publication "Semiconductor International", Sherman, Vol. 20, No. 8, p. 319–322 for example announce a decive, with electro-static chuck arrangement for the support of substrates during exposure. The chuck arrangement shows a conductive layer, which can be applied to the substrate via electrical supply contacts with electrical switch-off potentials. In case of potential application, an electro-static field develops, by means of which the substrate is held on a plane insulation layer, positioned above the conductive layer. In this case, the extent of the force of attraction between the chuck arrangement and the substrate is dependant upon the electrical voltage applied, the size of the conductive layer, (the so called chuck electrode), and the thickness of the insulation layer, located between the conductive layer and the substrate.

To avoid unintentional influence of the exposure beam path, appropriate measures have to be taken to prevent electro-static charging at unwanted locations of the supporting system or the exposure system, when applying electro-static chuck arrangements in exposure systems.

An appropriate measure is for example the use of non-magnetic materials. This is achieved in the described arrangement of the mentioned publication by using sapphire material.

Sapphire admittedly is non-magnetic, however the costs for purchase are extremely high and consequently the technological costs for the production of the plane bearing surface for the substrate are immense. Therefore, in the arrangement mentioned above, the 8" sized bearing surface has not completely been covered with sapphire material, but several 2" sized sapphire plates have been arranged via an intermediate layer of Niob. Disadvantageous in this case is the technologically elaborate manufacturing procedure for a multi-layer bearing surface.

In addition to this, the uniformity of the material, carrying the substrate, is not guaranteed, resulting in a non-uniformity of the supporting power as far as the entire bearing surface is concerned.

The U.S. Pat. No. 5,600,530 also describes a supporting device for substrates, where once again an electro-static chuck arrangement is provided. In this case, however, the material used for the insulation layer of the chuck arrangement is aluminium oxide, and the invention furthermore describes a procedure, in which the thick aluminium oxide layer is thinned down to the appropriate thickness. Due to its unfavourable properties in temperature-fluctuations, the use of aluminium oxide leads to detrimental problems. For the compensation of this disadvantage, the use of aluminium oxide to manage a high exposure accuracy leads to extensive measures in order to avoid positioning errors and/or deformations of the substrate on the aluminium oxide layer. A solution for this problem, resulting from the use of aluminium oxide, however, is no described in the mentioned patent.

Another substrate receiving device for treatment in an electron-beam-system is disclosed in U.S. Pat. No. 5,644,137. The arrangement described here, is equipped with interferometers for the positioning and observation of the table and so of the substrate during the movement in X, Y coordinates. A stabilisation of the substrate's position relative to the exposure system is reached, as some parts of the supporting system and the interferometer mirrors are manufactured from material of equal expansion-behaviour, resulting in a higher positioning precision in the directions X and Y.

Unfortunately, this patent does not mention any means and measures to solve the problem of material expansion in direction to coordinate Z, or the imprecision resulting from this.

Another disadvantage in the publications mentioned above, is the fact that the supporting systems do not provide technical feeding devices that enable the receiving of the substrate via e.g. a robot arm and its sensitive and exact positioning on the deposit area.

SUMMARY OF THE INVENTION

It is therefore the object of the invention to develop supporting systems in the abovementioned style with further improvements to facilitate a precise receiving from a handling system and a better positioning and shape stability during the exposure.

For a receiving and supporting unit of the abovementioned style, this task is solved through the characterizing features of claim 1. Further advantageous improvements are indicated in features of the sub-claims.

The receiving and supporting unit of the abovementioned style provides at least a second electrostatic chuck arrangement, which—similar to the first electro static chuck arrangement, that supports the substrate during exposure,—provides a bearing surface for the substrate, whereby the bearing surface of the first chuck arrangement und the bearing surface of the second chuck arrangement mutually form a bearing surface for the substrate, and whereby the bearing surface of the second chuck arrangement is positioned in Z direction, that is to say in the direction of the exposure light beam-path , relatively moveable to the bearing surface of the first chuck arrangement.

In regard to their holding force, both chuck arrangements are designed to support the substrate in a save position while placing it either on the first chuck arrangement or exclusively on the second chuck arrangement.

The arrangement in this invention offers the advantage, that both chuck arrangements can be counter-shift along the Z-direction, which renders possible to move the bearing surface of the second chuck arrangement up to receiving position $Z_2$, in which a robot arm keeps ready for take over into the exposure system. The receiving position $Z_2$ for instance is located in a distance $\Delta z$ from the bearing surface of the first chuck arrangement, which constantly remains in position Z1.

For a precise verbal distinction between the first and the second chuck arrangement, the term "supporting chuck" will subsequently be used for the first chuck arrangement, the term "handling chuck" for the second chuck arrangement, in accordance with their respective functions.

During operation of the receiving-and supporting system acc. to the invention, the handling chuck in position $Z_2$, moved out of the supporting chuck, takes over the substrate for instance from a robot arm and after the electro-static holding force between the handling chuck and the substrate has become effective, the handling chuck then is being moved back at least in a position, in which the bearing surface of both chucks forms a mutual plane in position Z1.

Since the bearing surface of the handling chuck is smaller than the substrate's surface to be supported, free sections of the substrate superimpose the bearing surface of the handling chuck. Not until the handling chuck has moved its bearing surface back toward position Z1, the substrate with its free surface sections comes into contact with the bearing surface of the supporting chuck and is positioned on both,—the bearing surface of the supporting chuck as well as the handling chuck, provided that the handling chuck remains in position Z1. The invention provides another method of implementation, in which the handling chuck—after moving back—remains in position Z1, in which the substrate is placed in exposure position and lies partly on the bearing surface of the supporting chuck and partly on the bearing surface of the handling chuck. In this position Z1, the handling chuck can alternatively be fixated through a clamp device or remains non-fixated in position Z1.

In the latter case, the bearing surface of the handling chuck is freely moveable into Z direction and—as soon as the electro static holding force between the supporting chuck and the substrate is effective, due to the strain—equalizing forces, performed by the substrate and provided that the two bearing surfaces are not in a mutual plane,—it can be pulled back into position Z1, in which the bearing surface of the supporting chuck is positioned.

In regard to an exact positioning of the handling chuck in position Z1, this method advantageously and without intensive technical requirements provides the strain-free support of the substrate without any risk of deformation.

However, another variant of the invented receiving and supporting system contains the possibility to disconnect the handling chuck from the substrate after locating the substrate on the bearing surface of the supporting chuck, and retract the handling chuck into position $Z_2'$, which applies to $Z_2' < Z1 < Z2$. In this case, the substrate merely lies on the bearing surface of the supporting chuck during exposure, while a free space remains between the bearing surface of the handling chuck and the substrate.

Another especially preferable variant of the invention may provide, that the bearing surfaces of both chuck arrangements are aligned parallel to the direction of earth's gravity influence, namely that for example the Y coordinate is positioned in the direction of the gravity influence while coordinate X, Z proceed right-angled to the gravity direction. In regard to the handling and positioning of the substrate, various advantages result from this method, which will be described in the following.

In connection with the vertical alignment of the bearing surfaces, in accordance with the invention, it is furthermore intended, that the two chuck arrangements are connected to a lifting device, which is moveable into direction of the Y coordinate, whereby the supporting chuck is fixated through a mounting plate, while the handling chuck is coupled with the lifting device through a linear adjusting drive, (moveable in direction Z).

In this way it is accomplished, that the two chuck arrangements with their vertically aligned bearing surfaces as well as the supported substrate can be adjusted by means of raising and lowering the lifting device into Y direction, keeping the distance to the exposure optic constant. Therefore it is intended to arrange the lifting device on a column, which is positioned parallel to coordinate Y, and to adjust the lifting device along this column linearly guided through skids and/or rollers, whereby in addition to the skids and/or rollers, piezo-electrically driven clamp devices for occasional click-stop detents of the lifting device at the column are provided.

During the exposure cycle for example, the lifting device then may be locked in its position directed to Y coordinate.

The column is connected to at least one X-carriage, by means of which the supported substrate can be moved in X-direction, constantly spaced to the exposure optic. It is therefore ensured, that each area fraction of the substrate can be brought into exposure position, on the one hand via movements of the lifting device in Y-direction and/or on the other hand via movement of the carriage in X-direction.

In another variant of the invention it can be provided, that the linear drive for the handling chuck is equipped with a pneumatic drive, such as a bellow or a membrane. These versions of pneumatic drives are well known in technique nowadays and therefore needn't be described precisely.

Another advantageous version of the invented arrangement renders possible to arrange the two chuck arrangements in a circular and concentric manner to each other, whereby the bearing surface of the handling chuck is encircled by the bearing surface of the supporting chuck, having an expansion of less $\frac{1}{3}$, preferably less $\frac{1}{4}$ of the bearing surface of the supporting chuck Thus guarantees, that the substrate, when supported on the handling chuck, exceeds the bearing surface laterally in a sufficient degree, and an adequate amount of projecting fractions of the substrate can be positioned on the bearing surface of the supporting chuck during the return phase.

According to the invention, it is furthermore provided, that each chuck arrangement consists of a basic body on which,—at least partly—an electrically conductive layer is deposited having an insulation layer above it, whereby the insulation layer is positioned towards the exposure optic, forming the bearing surface for the substrate.

Channels for a cooling medium may be built into the insulation layers, leading to inlets/outlets of the cooling medium, using helium as a preferable coolant.

In a very advantageous version, the mounting plates and the basic bodies of the chuck arrangements are made of glass-ceramic with the same material properties, for example with equal thermal expansion coefficient $\alpha_T = 0 \pm 0.05 \times 10^{-6} K^{-1}$, equal modulus of elasticity of $E \approx 90.6$ GPa and equal tensile strength of B about 130 MPa.

The utilisation of such glass ceramic for the parts in question allows a supporting system design, which is exceptionally insensitive to temperature-fluctuations. Since temperature- influences within the arrangement during the exposure cycle is technically inevitable, using those glass ceramics reduce the negative effects to an extent, that additional temperature-stabilizing measures within the exposure arrangement or temperature-stabilizing measures in the vicinity of the substrate to be exposed, can be reduced to a minimum.

A further essential advantage of glass ceramic is that conventional optic processing technologies during the production of the parts in question can be applied, through which effectively a maximum degree of accuracy can be obtained during processing. This refers especially to the fabrication of plane surfaces with maximum planeness requirements, but also in respect of keeping parallelisms and angles of the respective parts. This renders possible to meet manufacturing tolerances within the range of micrometer of arc seconds. Due to the brittle hardness of the implemented glass ceramics, plastic deformations of the plane surfaces, especially of the bearing surfaces of the substrate are excluded, whereby permanent deformations, caused by mechanical forces, cannot influence the substrate.

The skids and/or rollers for guidance of the lifting device and also the column are of a highly strong ceramic with a modulus of elasticity in the range of 300 to 400 GPa. Therefore, an accurate guidance of the lifting device along the column can be obtained. In addition to the skids and/or rollers, electrically driven clamp devices for at-times click-stop detents of the lifting device are provided, respectively in those positions, where the exposure of the substrate surface will be carried out.

With the utilization of glass ceramic respectively ceramic materials for the named parts, it is obtained, that the exposure beam path is not accidentally influenced by magnetic fields, since these materials are non-magnetic.

Besides, it is another advantage that these materials can be provided in a technologically simple manner with an electrically conductive layer, for example chrome or nickel, which can be supplied with an electric voltage potential. For a save support of the substrate on the bearing surfaces of the two chuck arrangements it is intended to attach an electric potential with up to 5000 Volts to the conductive layers on the one hand and at the substrate on the other hand.

In another very beneficial version of the invention it is provided, that two mirrored surfaces are attached to the mounting plate, one of which is directed to X-coordinate and the other is directed Y-coordinate, both serving as reference mirror of a meteorology system, in which the determination of the position of the mounting plate respectively to the substrate is carried out by interferometric measurings.

The mirrored surfaces can be an aluminium layer, supplied with an oxide protective layer, preferably $SiO_2$.

Furthermore, the mounting plate may show material recesses, which lead to a reduction in weight, advantageously resulting in lower driving forces as well as favourable acceleration behaviour during movement of the lifting device. Another variant is to attach the basic body of the first chuck arrangement either directly to the lifting device, or, alternatively connect it to the lifting device via a mounting plate.

BRIEF DESCRIPTION OF THE DRAWINGS

The subject matter of the invention is described with reference to the embodiments shown in the drawings.

DETAILED DESCRIPTION OF THE INVENTION

Figure 1:
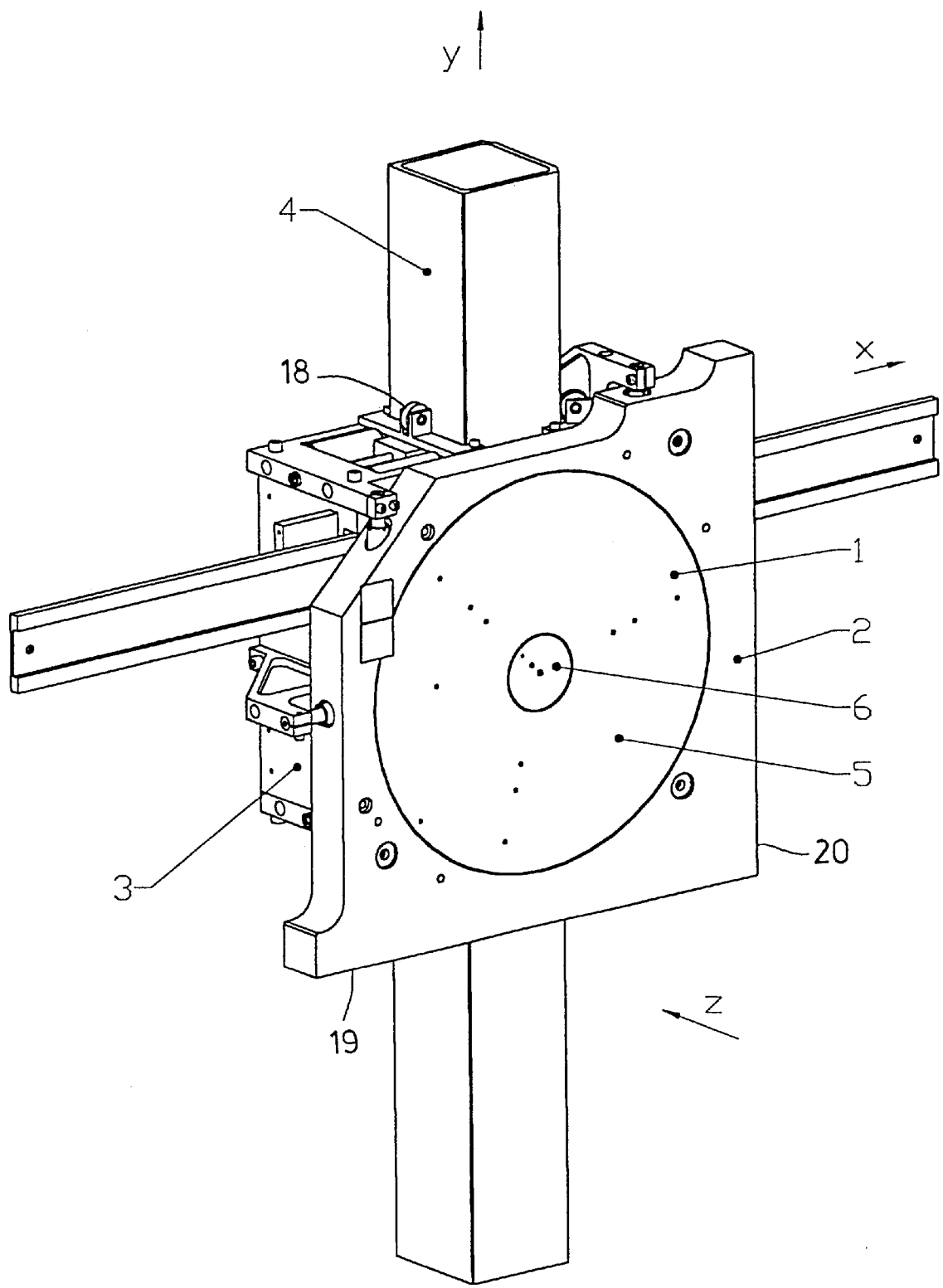
FIG. 1 the principal plotting of the arrangement according to the invention

FIG. 1 shows a receiving and supporting system, in which a first chuck arrangement, namely a supporting chuck 1 is connected to a lifting device 3 via a mounting plate 2.

The lifting device 3 is coupled to a column 4 via skids and/or rollers 18 and is longitudinally moveable in the direction of the column.

This arrangement is positioned in a such way, that the column 4 proceeds in Y direction, the Y coordinate corresponds to the gravity factor and the bearing surface 5 of the supporting chuck 1 is directed parallel to the plane, stretched in X, Y coordinates. The direction of the incident radiation of the exposure beam path, emanating from an unplotted exposure optic, proceeds in direction Z-coordinate, right-angled towards the bearing surface 5. The column 4 is connected to a X-coordinate linearly guided carriage, proceeding on the lineal, showed in X-direction. This ensures that the supporting chuck 1 with its bearing surface 5 is moveable in X, Y coordinates. The X-shift is effected via movement of the carriage, (not shown in the drawing), which is connected closely to the column 4; the Y-shift is effected by movement of the lifting device 3 alongside the column 4. Herewith, the carriage as well as the lifting device 3 are coupled with electromechanical drives, (also not shown in the drawing).

The guide way of these two assemblies during operation is processed highly accurate under the binding of all remaining degrees of freedom, so that a substrate 17, exemplary a wafer, located on the bearing surface 5, can be positioned relatively to the exposure optic, in such a way that, step by step, the exposure of the substrate 17 with a preset structure can be done.

Mirrors 19, 20 can be attached to the side faces, mutually perpendicular to the mounting plate 2, through which the position of the mounting plate 2 can be measured with interferometric precision.

Within the framework of the invention, it is furthermore intended to provide a second chuck arrangement in addition to the supporting chuck, namely a handling chuck 6

Figure 2:
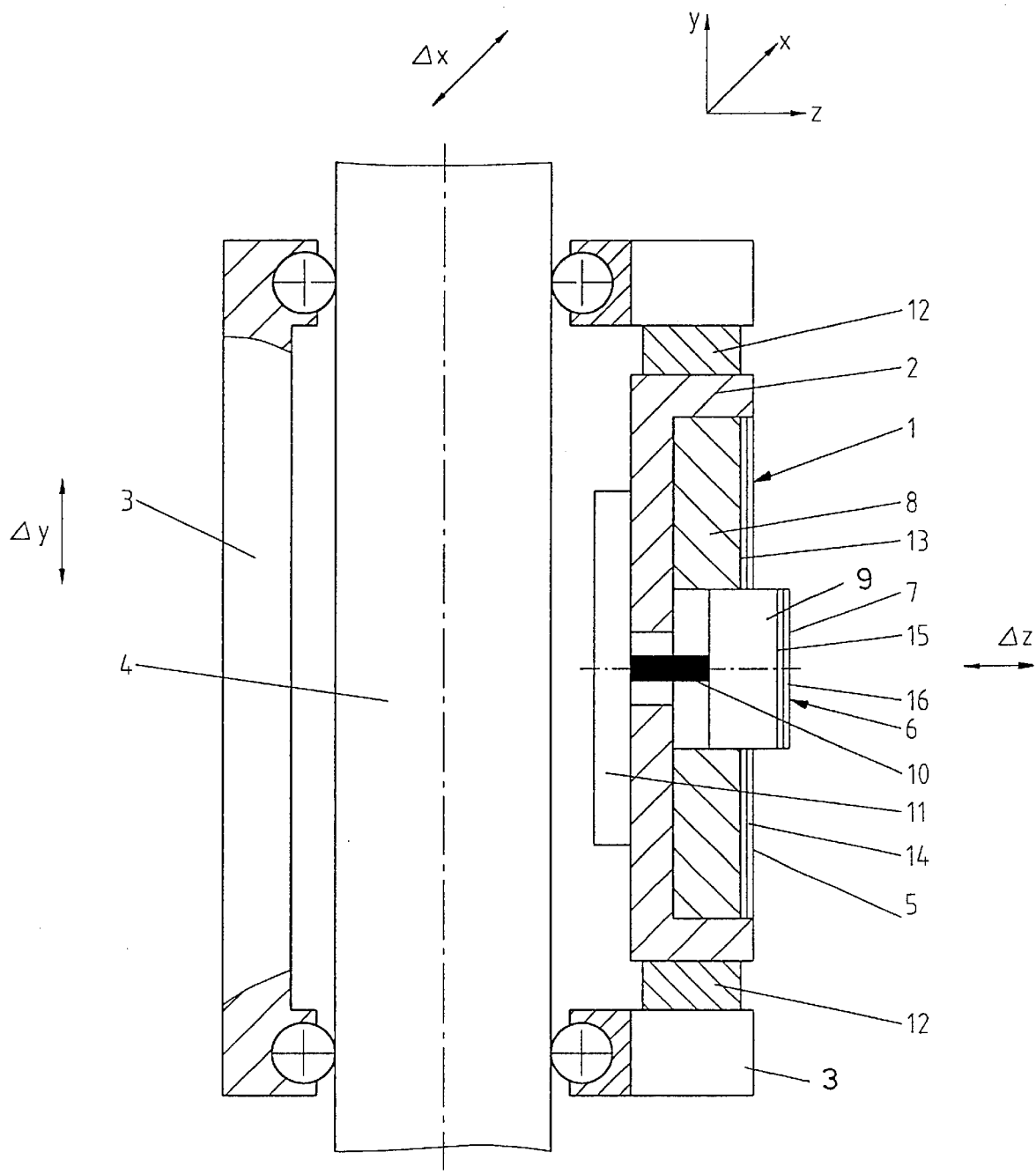
FIG. 2 a section of FIG. 1

The positioning of the two chuck arrangements 1 and 6 to each other can be seen in the section view of FIG. 2. Here, it is recognizable that the bearing surface 7 of the handling chuck 6 is parallel to the bearing surface 5 of the supporting chuck 1.

Both bearing surfaces 5, 7 are positioned perpendicular to coordinate Z and likewise to the incidence direction of the exposure light beam. However, while the supporting chuck 1 is firmly attached to the mounting plate 2, for example via clamps or screws, the handling chuck 6 can be moved along the Z direction.

Hereby, the basic body 8 of the supporting chuck 1 and the basic body 9 of the handling chuck 6 including the bearing surfaces 5 and 7 are arranged as circular areas. Both chucks 1, 6 are connected via constraint guidances (not shown in the drawing) which limit the degrees of freedom and therefore ensure an exact keeping to the relative position of the chucks 1, 6 to each other, especially in regard to their counter-twisting motion around the Z-coordinate.

Those constraint guidances exemplary can be built as balls, partially immersing in V-shaped grooves, whereby one of the chucks is provided with balls, while the other is provided with grooves.

The basic body 8 of the supporting chuck 1 is an opening in which the basic body 9 of the handling chuck is moveably guided. Furthermore, the basic body 9 of the handling chuck 6 is connected to a pneumatic drive 11 via a gear element 10. The movement of the handling chuck 6 in Z coordinate can be arranged by controlling the pneumatic drive 11. As shown in FIG. 2, the mounting plate 2 is connected cinematically determined to the lifting device 3 via solid pin joints 12.

An electrically conductive layer 13 of chrome or nickel with a thickness of <200 nm is plotted on the basic body 8 of the supporting chuck 1, directed towards the exposure optic, on which an insulation layer 14 is applied. On the insulation layer 14, the bearing surface 5 for the substrate 17 to be supported (not shown herein) is build highly plane. By analogue, this applies to the handling chuck 6, on whose basic body 9 firstly an electrically conductive layer 15 is deposited, on top of which an insulation layer 16 is plotted. In this case also, the insulation layer 16 is built highly plane as bearing surface for the substrate 17.

Figure 3:
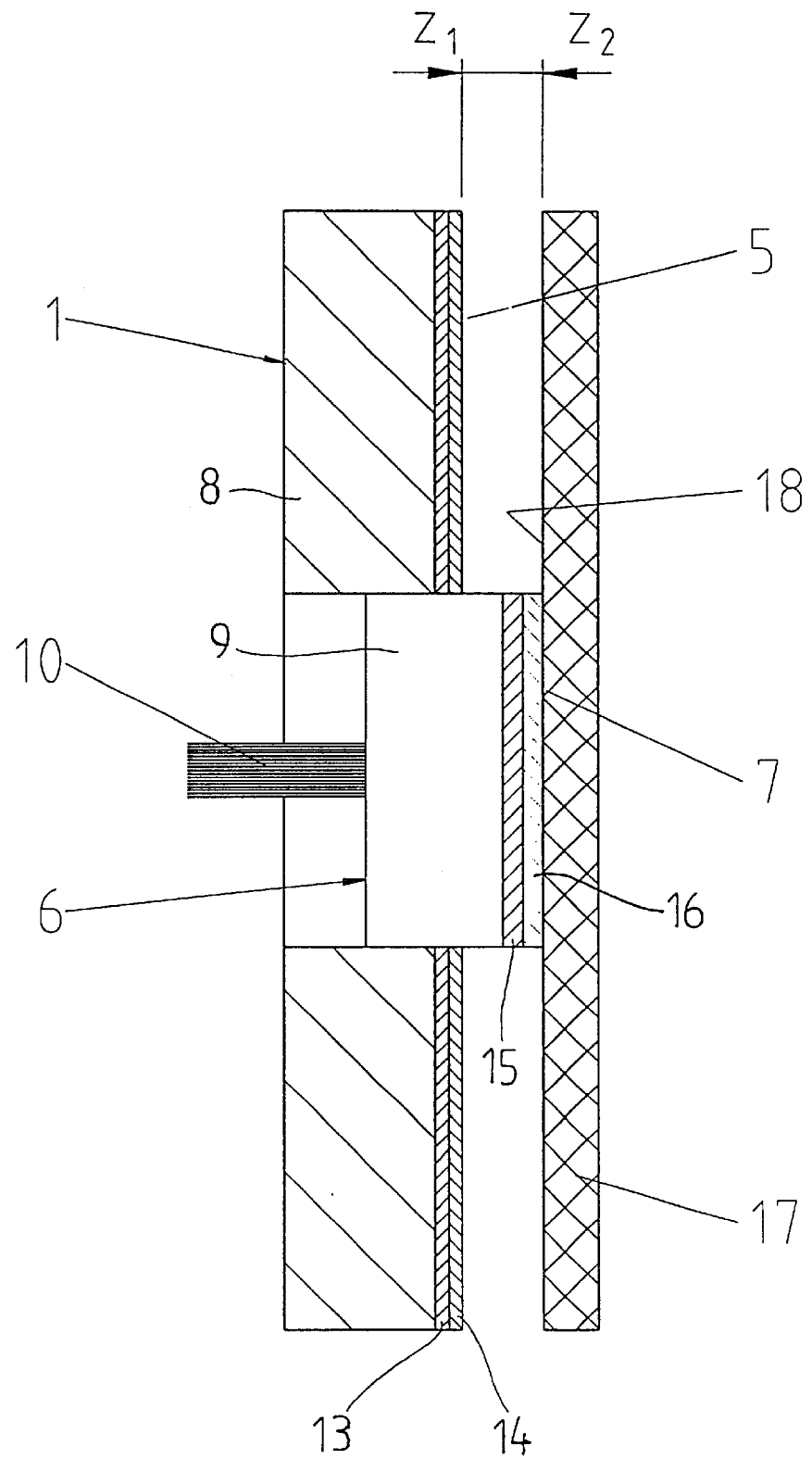
FIG. 3 the handling chuck with substrate in receiving position

The procedural details during receiving and supporting performances are now described in the following, according to FIG. 3 and FIG. 4. When putting the substrate 17 on the bearing surface 5 of the supporting chuck 1 for exposure, first of all its feeding will be done via a robot arm (not shown) up to a position $Z_2$. The substrate 17 should thereby be positioned approximately centred to the bearing surface 5 by using the robot arm. Now, the gear element 10 is controlled via the pneumatic drive 11, advancing the handling chuck 6 up to a position, so that fractions of the substrate surface 18, opposite to the bearing surface 7, reach contact with the bearing surface 7.

In the following, an electric voltage with a potential of approximately 4000 volts is conducted to the electrically conductive layer 15 of the handling chuck 6 on the one hand and to the substrate 17 on the other hand via electric contacts, not shown in the drawing. The electro-static forces, resulting from this performance, keep the substrate 17 on the bearing surface 7 of the handling chuck 6.

Now, the substrate 17 is being released from the robot arm and the robot arm is being swung out of the area between the substrate 17 and the exposure optic, not shown in the drawing. The pneumatic drive 11 is being controlled, pulling the handling chuck 6 into the supporting chuck 1 until the bearing surface 7 reaches the position $Z_1$. Consequently, the fractions of the substrate surface 18 not being overlapped by the bearing surface 7, attach to the bearing surface 5 of the supporting chuck 1.

Thus completes the movement of the handling chuck 6, respectively of the substrate 17. The positioning of the substrate 17 on the supporting chuck 1 puts the substrate into exposure position. In accordance with a preferable variant of the invention, the handling chuck 6 is not fixated in this position, but remains in a freely movable "swimming" Z-direction.

The electrically conductive layer 13 of the supporting chuck 1 is now also supplied with an electric potential of 4000 Volts via electric contacts (not shown in the drawing), with the result that in addition to the supporting force between handling chuck 6 and substrate 17, an electro-static supporting force between the supporting chuck 1 and the substrate 17 becomes effective.

The supporting position for the substrate 17 is exclusively determined through the position of the bearing surface 5 at the supporting chuck 1.

In fact, the substrate 17 still remains adherent to the bearing surface 7 of the handling chuck 6, which has no defined position in regard to the exposure optic, due to the "swimming" bearing of the handling chuck 6. The bearing surface 7 of the handling chuck 6 provides simply the shape stability of the substrate 17 by supporting the substrate surface 18.

On the other hand, the Z direction position of the bearing surface 7 is moved selfacting by the substrate surface 18 into position $Z_1$, which compensates a redundancy in determination of the substrate 17, respectively strains in the substrate material due to redundancies in determination.

The substrate 17 is now prepared for the exposure and is brought into the respective exposure position in which the deposition of the structure on the substrate 17 is effected, by controlling the X carriage for movement and controlling the lifting device for movement in Y coordinate. The removal of the substrate 17 from the exposure system is managed vice versa, by disconnecting the voltage potential between the substrate 17 and the supporting chuck 1, so that the substrate 17 is adherent only to the handling chuck 6. The handling chuck 6 with the substrate 17 is now moved in the direction of Z coordinate until the substrate surface 18 is positioned in $Z_2$, in which the substrate 17 then becomes engaged with the robot arm. In the following, the electrically conductive layer 15 also is switched potential-free and the removal of the substrate 17 out of the exposure system is effected via the robot arm.

Figure 4:
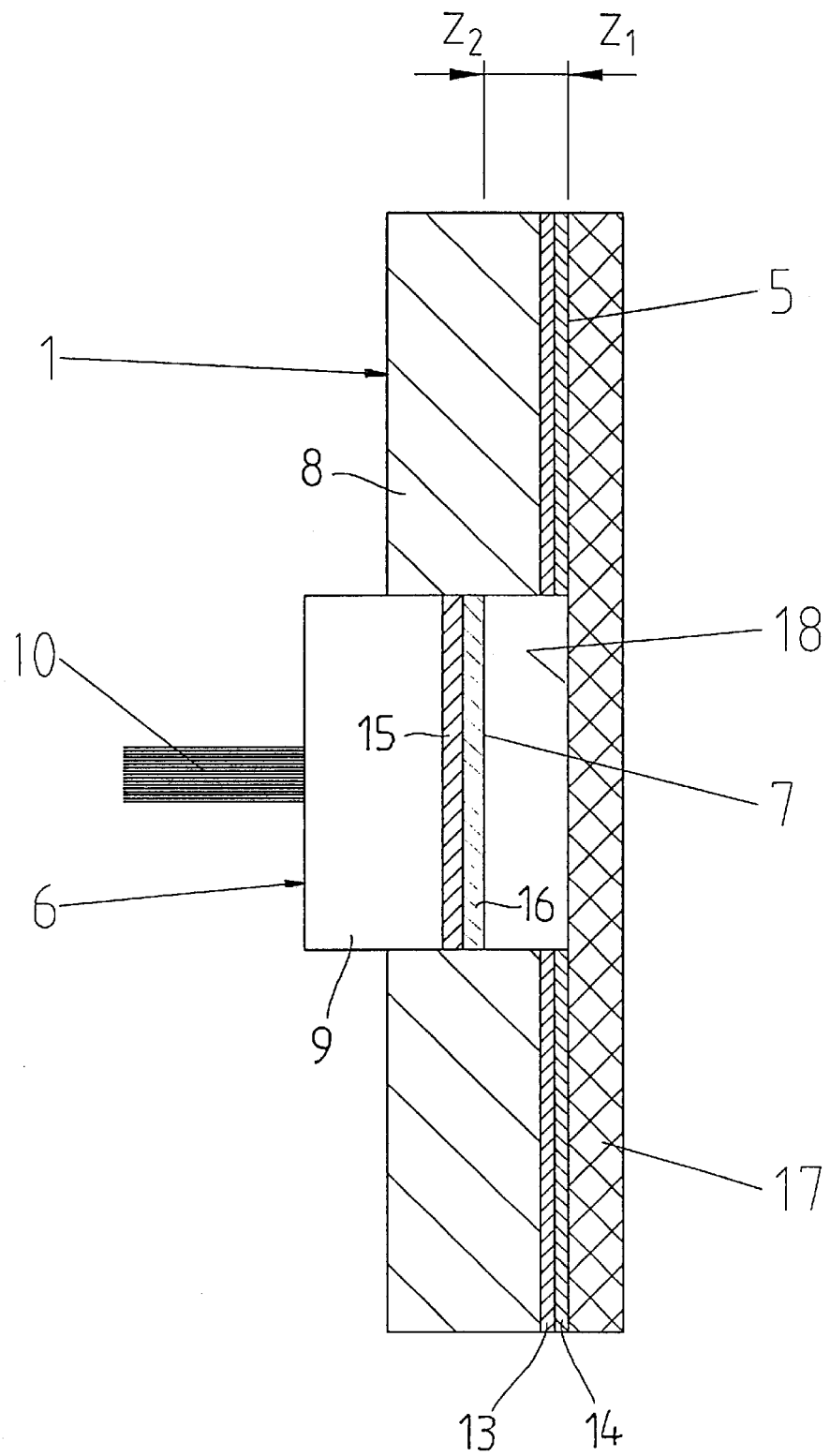
FIG. 4 supporting chuck and handling chuck with substrate in exposure position

In an alternative variant of the invention, described in FIG. 4, it may be provided, that the handling chuck 6, after positioning of the substrate 17 on the supporting chuck 1, does not remain in position $Z_1$, but is moved in a position $Z_2$, (after potential release of the electrically conductive layer 15) so that the substrate 17 during exposure is supported only by the supporting chuck 1.

In accordance with the invention, it is furthermore provided, that the basic bodies 8, 9 of the two chuck arrangements 1, 6 and the insulation layers 14, 16 of the two chuck arrangements 1, 6 are manufactured from glass ceramic "ZERODUR" and the mounting plate 2, the lifting device rack 3 and the column 4 are made of silicon carbide. This ensures, that temperature-influences are not negatively effecting the positioning accuracy of the substrate 17.

The invention has been described in detail with particular reference to certain preferred embodiments thereof, but it will be understood that variations and modifications can be effected within the spirit and scope of the invention.

PARTS LIST

1 First chuck arrangement (supporting chuck)
2 Mounting plate
3 Lifting device
4 Column
5 Bearing surface
6 Second chuck arrangement (handling chuck)
7 Bearing surface
8 Basic body
9 Basic body
10 Gear element
11 Pneumatic drive
12 Solid pin joints
13 Electrically conductive layer
14 Insulation layer
15 Electrically conductive layer
16 Insulation layer
17 Substrate (wafer)
18 Rollers
19 Mirror
20 Mirror

What is claimed is:

1. Receiving and supporting system for a substrate (17) in an exposure system, provided with an electrostatic chuck arrangement (1), moveable in X, Y coordinate, for supporting of the substrate (17) on a bearing surface (5) during exposure, characterized in that at least a second electro-static chuck arrangement (6) is provided, supplied with an additional bearing surface (7) for the substrate (17), whereby the second chuck arrangement (6) with its bearing surface (7) is positioned moveable in direction Z-coordinate relatively to the bearing surface (5) of the first chuck arrangement (1).

2. Receiving and supporting system according to claim 1, characterized in that the sum of the two bearing surfaces (5,7) correspond approximately to the surface expansion of the substrate (17) to be supported.

3. Receiving and supporting system according to claim 1, characterized in that the second chuck arrangement (6) is moveable in Z-direction up to the back position $Z_2$ in front of the bearing surface (5), which corresponds to a receiving position for the substrate (17).

4. Receiving and supporting system according to claim 1, characterized in that the second chuck arrangement (6) is moveable in a Position $Z_1$, in which the bearing surfaces (5,7) are on a mutual plane, whereby the position $Z_1$ corresponds to the supporting position of the substrate (17) during the exposure.

5. Receiving and supporting system according to claim 1, characterized in that the second chuck arrangement (6) is moveable in a position $Z_2$, in which the bearing surface (7) is positioned behind the bearing surface (5).

6. Receiving and supporting system according to claim 1, characterized in that the bearing surfaces (5,7) are built as circular areas, positioned centric to one another, whereby the bearing surface (7) is encircled by the bearing surface (5), having an expansion of less than ⅓, preferably ¼ of the bearing surface (5).

7. Receiving and supporting system according to claim 1, characterized in that the Y coordinate is positioned parallel to gravity direction and the coordinates X, Z right angled to the direction of gravity influence.

8. Receiving and supporting system according to claim 1, characterized in that the two chuck arrangements (1,6) are connected to a lifting device (3), linearly moveable in Y coordinate, whereby the first chuck arrangement (1) is firmly attached to the lifting device (3) and the second chuck arrangement (6) is coupled to the lifting device (3) via a linear drive, that serves as Z motion of the second chuck arrangement (6).

9. Receiving and supporting system according to claim 8, characterized in that the first chuck arrangement (1) is connected to the lifting device (3) by means of a mounting plate (2).

10. Receiving and supporting system according to claim 8, characterized in that the lifting device (3) is attached to a column (4) positioned parallel to Y coordinate, and along this column (4) is movable straight-guided by means of skids and/or rollers (18), whereby in addition to the skids and/or rollers (18), electrically driven clamp devices for occasional click-stop detents of the lifting device (3) are provided.

11. Receiving and supporting system according to claim 10, characterized in that the clamp devices are coupled with piezo-electric drives.

12. Receiving and supporting system according to claim 1, characterized in that the column (4) is connected with at least one X carriage.

13. Receiving and supporting system according to claim 1, characterized in that a pneumatic drive (11) is provided as linear drive of the second chuck arrangement (6).

14. Receiving and supporting system according to claim 1, characterized in that each of the two chuck arrangements (1,6) is composed of a basic body (8,9), having at least partly electrically conductive layers (13,15) each with an insulation layer (14,16) above it, whereby the insulation layers (14,16) form the bearing surfaces (5,7) for the substrate (17).

15. Receiving and supporting system according to claim 1, characterized in that the mounting plate (2) and the basic bodies (8,9) are manufactured from glass ceramic, having a thermal expansion coefficient $\alpha_T=0\pm0.05*10^{-6}K^{-1}$ and modulus of elasticity of $E\approx 90.6$ GPa.

16. Receiving and supporting system according to claim 1, characterized in that the skids and/or rollers (18) and the column (4) are made of a solid glass ceramic with a modulus of elasticity of approximately 300 to 400 GPa.

17. Receiving and supporting system according to claim 1, characterized in that firstly during the receiving of the substrate (17), the electrically conductive layer (15) of the second chuck arrangement (6) on the one hand side, and the substrate (17) on the other hand side, and secondly during the support of the substrate (17) in exposure position, the electrically conductive layer (13) of the first chuck arrangement (1) as well as the substrate (17) are connected to an electric potential of up to 5000 Volts.

18. Receiving and supporting system according to claim 1, characterized in that two mirrors (19,20) are attached to the mounting plate (2) and/or the first chuck arrangement (1), serving as reference mirrors for a metrology system, and of which respectively one of them is directed to X, Y coordinates.

19. Receiving and supporting system according to claim 1, characterized in that the mounting plate (2) and/or the basic bodies (8,9) are provided with material recesses for weight reduction.

20. Receiving and supporting system according to claim 1, characterized in that the insulation layers (14,16) are provided with channels for a coolant, whereby the channels lead to inlets/outlets for the coolant and as a coolant, preferably helium is applied.

* * * * *